United States Patent [19]

Dougall et al.

[11] Patent Number: 5,504,876
[45] Date of Patent: Apr. 2, 1996

[54] MEMORY APPARATUS HAVING PROGRAMMABLE MEMORY TIME SLOTS

[75] Inventors: David A. Dougall; Gavin A. Walker, both of Basingstoke, England

[73] Assignees: Sony Corporation, Tokyo, Japan; Sony United Kingdom Limtied, Middlesex, England

[21] Appl. No.: 234,710

[22] Filed: Apr. 28, 1994

Related U.S. Application Data

[63] Continuation of Ser. No. 738,683, Jul. 31, 1991, abandoned.

[30] Foreign Application Priority Data

Sep. 25, 1990 [GB] United Kingdom ................... 9020876

[51] Int. Cl.⁶ ..................................................... G06F 12/00
[52] U.S. Cl. ............................ 395/494; 395/481; 395/405
[58] Field of Search ..................................... 395/425, 405, 395/494, 481; 364/200 MS File, 900 MS File, DIG. 1, DIG. 2; 365/230.03

[56] References Cited

U.S. PATENT DOCUMENTS

| | | | |
|---|---|---|---|
| 4,183,058 | 1/1980 | Taylor | 358/127 |
| 4,485,402 | 11/1984 | Searby | 358/160 |
| 4,564,915 | 1/1986 | Evans et al. | 340/701 |
| 4,789,963 | 12/1988 | Takahashi et al. | 395/325 |
| 4,928,234 | 5/1990 | Kitamura et al. | 395/425 |

*Primary Examiner*—Jack A. Lane
*Attorney, Agent, or Firm*—William S. Frommer; Alvin Sinderbrand

[57] ABSTRACT

A programmable memory cycle is entered on a keyboard and set by a remote system control processor. Each local processor controls memory access to memory boards in accordance with the set memory cycle. When the memory cycle is divided into four memory access slots, the processor can provide, in each memory cycle, three read slots and one write slot, two read slots and two write slots, or one read slot and three write slots. When used for processing video signals, the arrangement can process three video channels, or more if expanded by the provision of further memory boards and local processors.

10 Claims, 3 Drawing Sheets

MEMORY APPARATUS HAVING PROGRAMMABLE MEMORY TIME SLOTS

This application is a continuation of application Ser. No. 07/738,683, filed 7/31/91, now abandoned.

BACKGROUND OF THE INVENTION

1. Field of the Invention

This invention relates to memory apparatus, and in particular but not exclusively to memory apparatus for video data processing.

2. Description of the Prior Art

In known memory architectures, a fixed memory cycle is generally defined such that read access and write access to the memory is performed in accordance with a predetermined and unvariable scheme, buffers and latches being provided to set the required data routing.

The use of such a fixed memory cycle can be disadvantageous in certain circumstances, for example when the number of required read operations exceeds the number of write operations, or vice versa. In this case, slots in the memory cycles allotted to a particular operation, for example write slots, will often remain vacant if the requirement is for a greater number for another operation, for example reading. This represents uneconomic use of the memory and results in an overall decrease in processing speed.

One area in which the above problem arises is in video data processing, for example for manipulation of image data from a number of different video data channels. In such a video data processing system, it may for example be necessary to write in data from a greater number of channels than are being read from at that time. Alternatively, a greater number of channels may need to be read rather than written. When the video data is being processed in real time, the decrease in processing speed resulting from the "wasted" access slots in a fixed memory cycle scheme represents a considerable disadvantage.

SUMMARY OF THE INVENTION

It is an object of the present invention to provide memory apparatus having a flexible memory architecture which can overcome the above problems arising in the prior art arrangements.

It is another object of the present invention to provide memory apparatus in which the memory architecture is readily expandable.

It is a further object of the present invention to provide memory apparatus having a memory access cycle in which access slots need not be wasted as a result of utilization of particular read/write schemes.

It is a still further object of the present invention to provide memory apparatus having increased processing speed as a result of the use of a flexible memory cycle.

It is a yet further object of the present invention to provide memory apparatus for video data processing which includes a flexible and readily expandable memory architecture.

According to one aspect of the present invention there is provided a memory apparatus comprising:

at least one memory block including a memory means exhibiting a memory cycle;

a local processor associated with each memory block for controlling access thereto and having a plurality of respective input/output ports for writing/reading of data to/from each memory block; and control means for selectably and variably controlling the memory cycle in each local processor such that each memory cycle is divided into a number of memory access slots, and each access slot can be selectably and variably controlled for either a memory write or memory read access slot.

According to another aspect of the present invention there is provided a memory apparatus for video data processing, the apparatus comprising:

at least one memory block including a memory means exhibiting a memory cycle;

a local processor associated with each memory block for controlling access thereto and having a plurality of respective input/output ports for writing/reading of video data on a corresponding plurality of channels to/from the or each memory block; and control means for selectably and variably controlling the memory cycle in each local processor such that each memory cycle is divided into a number of memory access slots, and each access slot can be selectably and variably controlled for either a memory write or memory read access slot for a respective one of the channels.

A preferred embodiment of the invention, described in greater detail below, provides a flexible and readily expandable memory architecture which is particularly suitable for video data processing. The system can be configured from a single channel composite video store up to a three-channel component video store simply by the addition of further memory boards to the memory block. In a three-channel system, the system configuration can change mode, such as from a three-channel write and one-channel read mode to a two-channel write and two-channel read mode (and the like) simply by setting a control system to define the read or write operation for each time slot of the memory access cycle. Any part of the memory may be written to from any of the input ports or read from any of the output ports at any time. The memory cycle can be set by any suitable input means such as a keyboard.

The storage capability of the memory can be expanded on either a board basis or a block basis without the need to change the basic system architecture. The architecture also allows for the expansion of the memory by using larger storage capacity devices such as 4 Mbyte or 16 Mbyte random access memory (RAM), by means of extending the number of address lines available to these devices.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
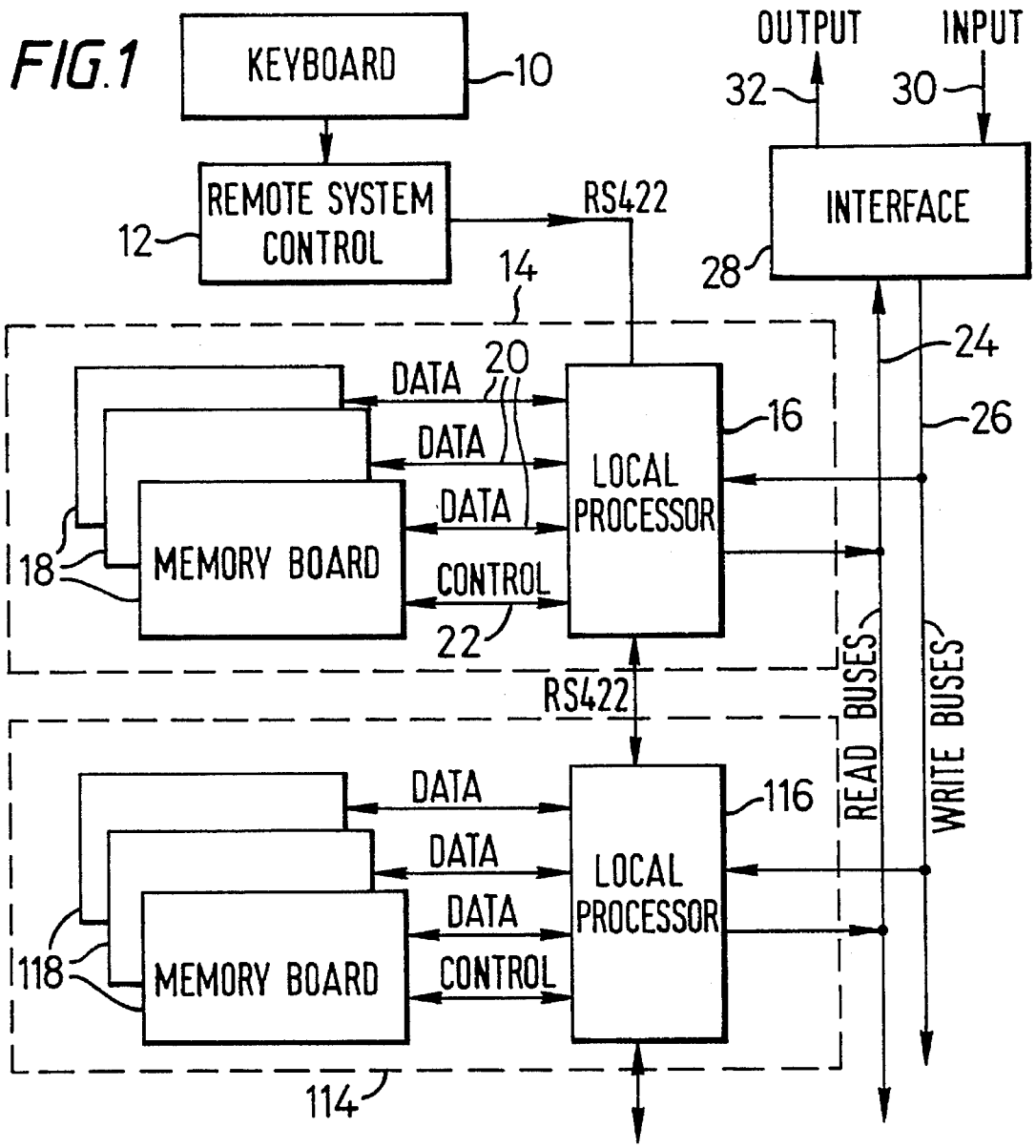
FIG. 1 is a block circuit diagram of memory apparatus according to an embodiment of the present invention.

Referring to FIG. 1, there is shown memory apparatus suitable for digital video data processing. An input device such as a keyboard 10 is connected to a remote system control 12 preferably in the form of a processor which is itself connected via an RS422 interface to a local processor 16 of a memory block 14. The memory block 14 also includes a number of memory boards 18 which are connected by data lines 20 and a control line 22 to the local processor 16. The local processor 16 is also connected to parallel read buses 24 and parallel write buses 26 which are themselves connected via an interface 28 to a data input 30 and a data output 32.

The memory apparatus can function as thus-far described but, if desired, it can be expanded by the provision of a second memory block 114 also including a local processor 116 and a number of memory boards 118. The connection of the second memory block 114 is similar to that described above, its local processor 116 being connected to the local processor 16 via an RS422 interface, and to the read and write buses 24,26.

Further memory blocks (not shown) can be provided in a similar manner, and this allows for ready expansion of the memory.

The processor of the remote system control 12 effectively controls the system by interpreting commands entered on the keyboard 10. The local processor 16 (or each of the local processors 16,116, . . . etc.) only controls access to the respective memory boards.

The basic system can be expanded by the addition of further memory boards to which the data buses are "parallel bussed". The local processor 16 may access typically up to sixteen memory boards; however, in a video data processing context, this may be limited to twelve boards giving, for a three-channel system, four boards per channel. For a component system, that is a system in which the video signals are in the form of separate color component signals, two of the four boards will be for storing luminance signals and the other two boards will be for storing chrominance signals. The system is flexible and expandable in that the basic memory unit will operate with only one local processor and one memory board and one video data channel; this could be used in a composite system (namely one in which the video signals are in the form of composite color signals) giving the video data approximately three seconds of storage in the memory. The more boards to be added, the greater the flexibility of the system, both in the number of video data channels (up to three write/read channels) and in the store length available.

In a basic system of a three-write-channel composite memory, a minimum of four boards will be required, namely one local processor control board and three memory boards.

In a basic three-channel component system, seven boards will be required, namely one local processor control board and six memory boards, three for luminance and three for chrominance.

Digital video data is supplied via the input 30 and the interface 28 and is parallel bussed along the buses 24,26 to the local processor 16 which selects (on the basis of instructions from the remote system control 12 as entered on the keyboard 10) which of the memory boards 18 that data is to be written to (or read from). As mentioned above, the system is expandable in two ways. Firstly, the system can be expanded on a board basis, such that the local processor can control from as little as one memory board up to typically sixteen memory boards, or even more in certain applications. Secondly, the system can be expanded on a block basis which involves the addition of further blocks each including a local processor and respective memory board(s).

Figure 2:
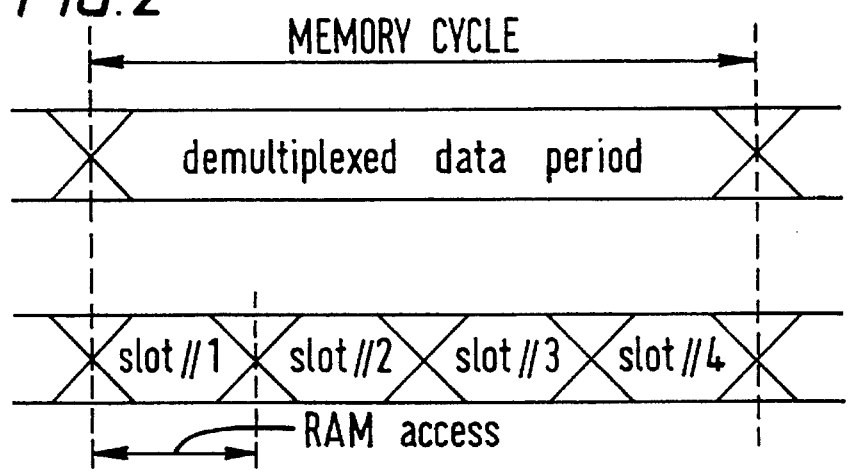
FIG. 2 shows a memory cycle divided into four time slots.

In the system shown in FIG. 1, the preferred memory architecture has three input or write ports and three output or read ports. The system is configured to be fully flexible so as to provide selectively three write channels and one read channel, or two write channels and two read channels, or one write channel and three read channels. This is accomplished by allowing demultiplexing such that four separate accesses to the memory can be made during the period of one memory cycle. This is shown in FIG. 2, in which a memory cycle defining a demultiplexed data period is divided into four time slots, slot 1 to slot 4, each time slot being available for a single RAM access. The remote system control 12 sends information to the particular local processor 16 as to which of four fields (of video data) are to be accessed at any one time and which are to be read or written. This information is passed to the local processor 16 in the form of four field numbers and a mode word which defines which of the four slots within the demultiplexed data period are read or write operations. The mode of operation can be changed simply at the keyboard 10 by assigning each of the four slots within a demultiplexed data period to be either a read or a write operation.

In the case of a specific design, suitable for 525 (line) composite video processing, it has been found necessary to demultiplex the data sixteen ways, so that a memory cycle takes sixteen sample periods, to allow for the four separate RAM accesses. With current dynamic RAM (DRAM) technology, this has to be done in order to perform the four DRAM accesses during a single composite sample period. Thus, in such a composite system, a complete RAM cycle will be 56 nS×16= 896 nS. Accordingly, a single channel access must take only 896 nS/4=224 nS.

Figure 3:
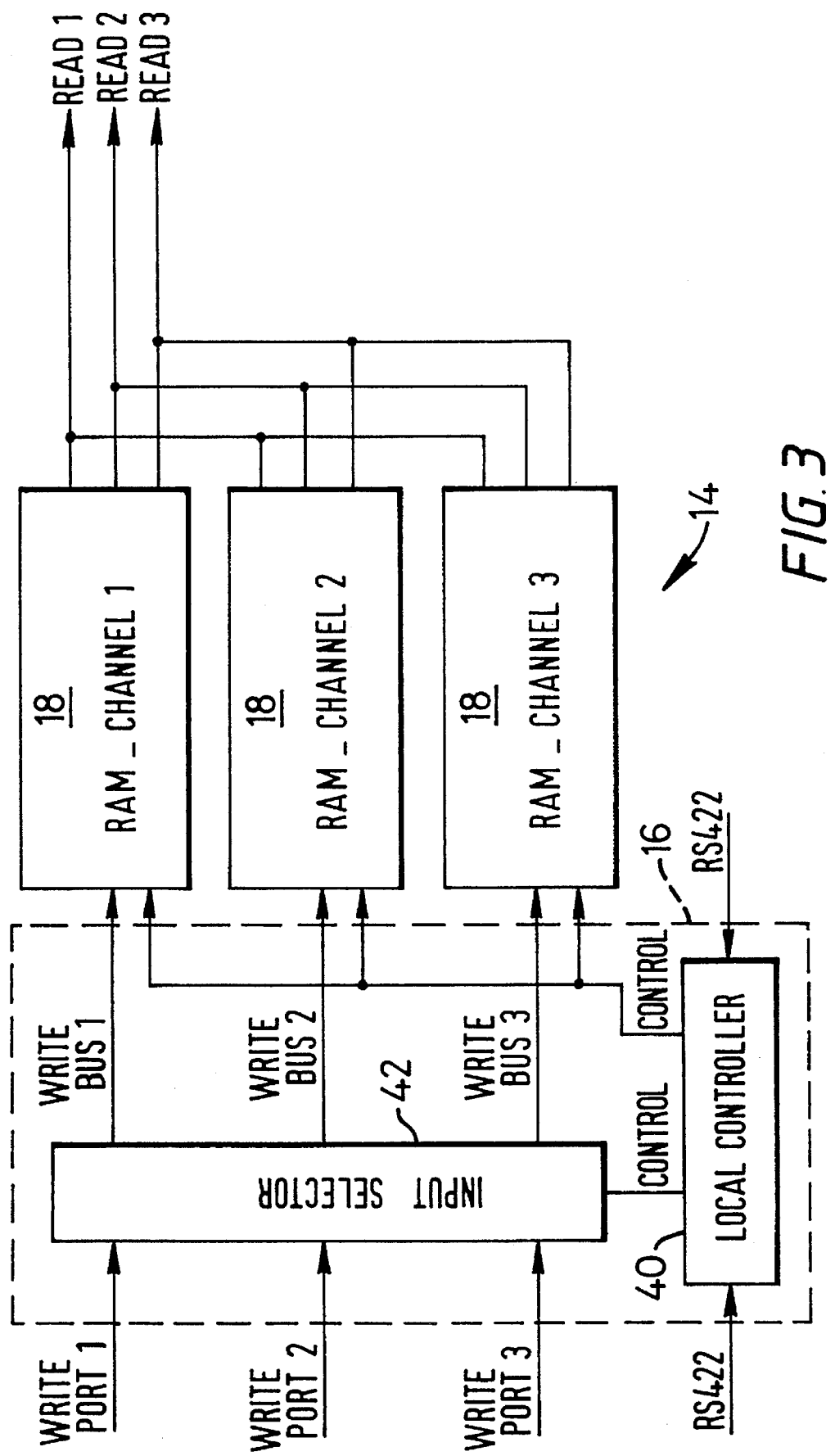
FIG. 3 is a block circuit diagram of an implementation of a memory block which can be used in the embodiment of FIG. 1.

FIG. 3 shows one implementation of the memory block 14 in greater detail. The local processor 16 includes a local controller 40 and an input selector 42. Write ports 1 to 3 are selectably connected via the input selector 42 to write buses 1 to 3, these providing respective signal paths to the memory boards 18, configured as RAM-channel 1 to RAM-channel 3. The read and write ports are connected to the read and write buses 24,26 shown in FIG. 1, and these are parallel bussed to other memory blocks (such as the memory block 114). In the situation that twelve memory boards 18 are provided, these are divided into three separate channels. Any input port can write to any RAM-channel according to the path provided by the input selector 42 in accordance with the local controller 40. However, in the arrangement of FIG. 3, only one input port may write to any RAM-channel at a particular time. Thus in the single-write channel mode (WRITE-1), the selected input port will sequentially write around the store, writing to each RAM-channel in turn. For the two-channel write mode (WRITE-2), the two input ports write to their selected channel while time sharing access to the third RAM-channel such that they are not writing to the same channel at the same time. This restriction has been placed on the system as it reduced the hardware whilst not limiting any practical If unction of the memory in the required application. There is no restriction on the read-side as any channel can be read by any port at any time; thus the same field may be read out on the three output channels simultaneously.

Within each RAM-channel there can be up to four memory boards 18 (two luminance and two chrominance for the component system). Each board receives data from the same write bus, and this must be enabled before writing data into its RAM or reading data on to the read buses. Each board 18 is thus given a unique number (1 to 12 for the memory unit). This may be constituted by a selectable on-board switch ore, hard wired on to the back plane of the board. The local controller 40 controls which board 18 is enabled at any time by sending out a board number on which the particular field to be accessed is stored. These are the four most significant bits (msb) of the RAM address (see below). Each board 18 is able to compare its own unique board number with the address board number and enable or disable its inputs and outputs accordingly. On each board 18 of each RAM-channel, there are 8 RAM-BIT channels (not shown). Each of these RAM-BIT channels deals with a single bit of the data word so that, for example, 8-bit wide data requires 8 RAM-BIT channels. The system may be expanded to handle 10-bit wide data by the addition of further RAM-BIT channels. Within each RAM-BIT channel are devices (not shown) which perform the 16-way demultiplexing and multiplexing of the data.

Each demultiplex/multiplex device transfers data to and from sixteen paired DRAMs (not shown), which can be considered as eight DRAM units with four bits going to one DRAM and four bits going to the other. It must therefore be possible to access each of these DRAM units independently (for each RAM-BIT channel) such that the same data is not written to more than one DRAM. This is done by use of the RAM address, the top four msb of the RAM address specifying which board is accessed. The next three msb will thus specify which one of the eight DRAM units is accessed at any one time.

Each memory board 18 thus contains 256 DRAMs, thirty-two of which are accessed simultaneously for a read or write operation.

During the vertical blanking intervals of the video signals, the local processor 16 loads a 13-bit mode word to the input selector 42 along with loading a respective four 25-bit address counters (not shown) with the base addresses of the four fields to be accessed during the next field period.

The mode word is structured as follows:

| BIT 12 | Memory unit accessed | |
|---|---|---|
| BIT 11 | COMPOSITE/COMPONENT mode | |
| BIT 10 | 625/525 operation | |
| BIT 9 | WRITE_mode msb | ) give the four modes of operation |
| BIT 8 | WRITE_mode lsb | |
| BIT 7 | SLOT_1 msb | ) port number to be accessed |
| BIT 6 | SLOT_1 lsb | |
| BIT 5 | SLOT_2 msb | ) port number to be accessed |
| BIT 4 | SLOT_2 lsb | |
| BIT 3 | SLOT_3 msb | ) port number to be accessed |
| BIT 2 | SLOT_3 lsb | |
| BIT 1 | SLOT_4 msb | ) port number to be accessed |
| BIT 0 | SLOT_4 lsb | |

The 16 clock RAM-cycle, during which time the four fields are accessed, is divided into four slots at four clock samples as shown in FIG. 2.

During each slot, an access to a particular field is made whether reading or writing. There are restrictions on which slots can be read or write accesses. Thus the four modes of operation are:

| | SLOT | | | |
|---|---|---|---|---|
| MODE | 1 | 2 | 3 | 4 |
| WRITE_0 | — | READ | READ | READ |
| WRITE_1 | WRITE | READ | READ | READ |
| WRITE_2 | WRITE | WRITE | READ | READ |
| WRITE_3 | WRITE | WRITE | WRITE | READ |
| MODES: | WRITE_MODE msb | | WRITE_MODE lsb | |
| WRITE_0 | 0 | | 0 | |
| WRITE_1 | 0 | | 1 | |
| WRITE_2 | 1 | | 0 | |
| WRITE_3 | 1 | | 1 | |

During any SLOT1 time of the RAM-cycle, any write port may access a write bus; thus the SLOT1 msb and SLOT1 lsb define which port number is accessing the bus at the SLOT 1 time.

| SLOT No msb | 0 | 0 | 1 | 1 |
|---|---|---|---|---|
| SLOT No lsb | 0 | 1 | 0 | 1 |
| PORT ACCESS | X | 1 | 2 | 3 |

Whether the port in a particular slot is a read or write port is determined by the mode of operation (WRITE0, etc). At the end of horizontal blanking, the address counters count every 1/16th clock cycle, producing the address for the DRAMs on the memory board. The 25-bit address is structured as follows:

| BITS 21 to 24 | Board No containing the required field |
|---|---|
| BITS 18 to 20 | RAM No containing the required field |
| BITS 9 to 17 | ROW_ADDRESS for the RAM |
| BITS 0 to 8 | COLUMN_ADDRESS for the DRAM. |

The design of the system for processing video signals has been specified such that it will operate up to 4 fsc for PAL systems (around 17.72 MHz). The only difference in the operation of composite or component is that the component system assigns half the boards in any one group as luminance and the other half as chrominance. This means that there are separate write buses for luminance and chrominance. The selection of the write port to particular boards is very simple and can be done on the memory board 18, as shown in FIG. 4.

Figure 4:
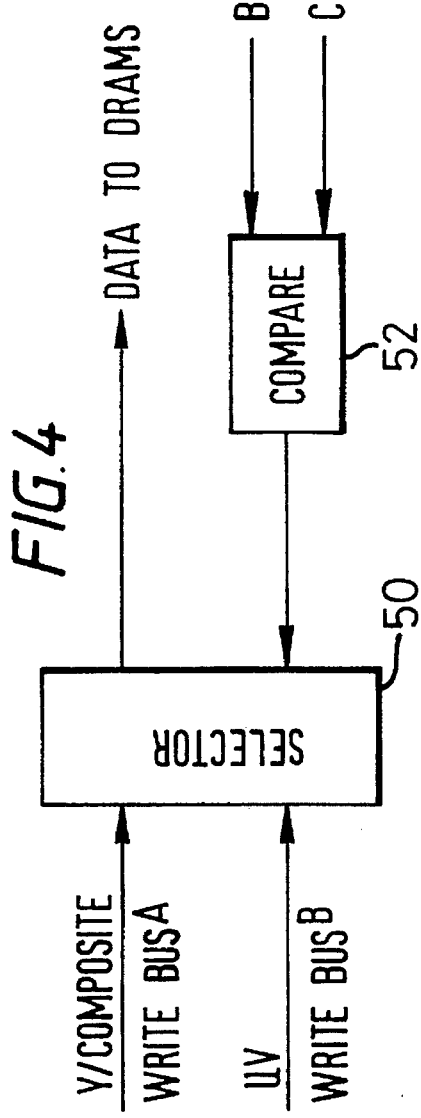
FIG. 4 is a circuit diagram of a selector system in a selectable composite/component video system.

Referring to FIG. 4, a luminance (Y) write bus A and a chrominance (UV) write bus B are shown connected to a selector 50. A compare block 52 receives board number data and a composite/component switch signal.

In component mode, the write buses A and B will have to be written to simultaneously; thus it is necessary to include the composite/component switch in the mode word. Each board will have two buses at eight bits per channel.

Each board receives on its back place a write bus A and a write bus B for each input channel. The selector 50 selects between either write bus A or write bus B, controlled by line, generated from the board number and the composite/component signal.

Figure 5:
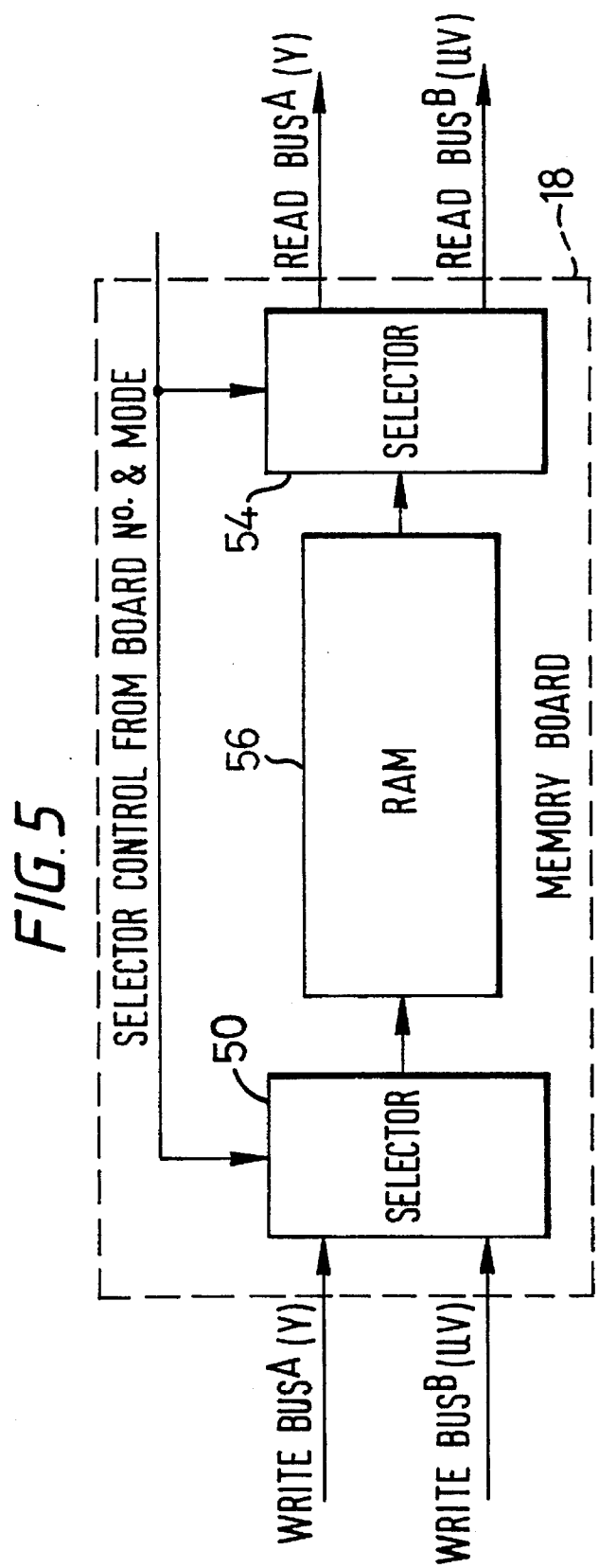
FIG. 5 is a circuit diagram of a selector system similar to that of FIG. 4, but also providing composite/component selection for read operations.

For a composite system, the data is put on to write bus A. Data passes through the system on the A-side of the write and read buses. In a component system, the luminance (Y)

signal is put on to write bus A and the chrominance (UV) signal on to write bus B. The input bus for each board is selected according to each board number by the local processor 16 such that some boards are luminance (reading and writing on the A-side) and other boards are chrominance (reading and writing on the B-side). This is shown in FIG. 5 in which the memory board 18 includes selectors 50,54 respectively for writing and reading, controlling access to a RAM 56.

Embodiments of the invention have been described in the context of video data processing, and this is a particularly suitable application which can benefit significantly from the flexible read/write access technique, as well as the expandable nature of the memory architecture. However, the invention is not limited to this particular field and can be applied whenever such flexibility of operation and/or storage capacity expandability is desired.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Memory apparatus comprising:

at least one memory block each including memory means having a memory cycle, the memory cycle having a predetermined number of memory access slots, local processor means for controlling access to the respective memory means and a plurality of input/output ports for respectively writing data into and reading data from the memory means;

user input means for receiving an allocation assignment from a user assigning each memory access slot to be either a memory write or a memory read access slot during a single period of said memory cycle; and control means, coupled to said at least one memory block and to said user input means, for selectively and variably controlling the predetermined number of memory access slots for each said local processor means, with each of the memory access slots being selectively and variably controlled according to said allocation assignment so as to be either said memory write or said memory read access slot during a single period of said memory cycle.

2. Memory apparatus according to claim 1, wherein each said memory means includes a plurality of memory boards.

3. Memory apparatus according to claim 1, comprising a plurality of said memory blocks and further comprising a data bus and wherein the plurality of said local processor means of said plurality of memory blocks are connected in parallel by way of said data bus to said user input means.

4. Memory apparatus according to claim 1, wherein each said local processor means has three of said input/output ports, and wherein said control means sets each said memory cycle so as to have four of said memory access slots.

5. Memory apparatus according to claim 4, wherein said control means controls said memory access slots for each said memory cycle so as to have one of: three said memory write access slots and one said memory read access slot; two said memory write access slots and two said memory read access slots; and one said memory write access slot and three said memory read access slots.

6. Memory apparatus according to claim 1, wherein said user input means includes a keyboard means.

7. Memory apparatus for temporarily storing video data, said apparatus comprising:

at least one memory block each including memory means having a memory cycle, the memory cycle having a predetermined number of memory access slots, local processor means for controlling access to the respective memory means, a plurality of video data channels and a plurality of input/output ports connected to the video data channels for respectively writing the video data into and reading the video data from the memory means;

user input means for receiving an allocation assignment from a user assigning each memory access slot to be either a memory write or a memory read access slot during a single period of said memory cycle; and control means, coupled to said at least one memory block and to said user input means, for selectively and variably controlling the predetermined number of memory access slots for each said local processor means, with each of the memory access slots being selectively and variably controlled according to said allocation assignment so as to be either said memory write or said memory read access slot for a respective one of the video data channels during a single period of said memory cycle.

8. Memory apparatus for temporarily storing video data according to claim 7, wherein each said local processor means has three said input/output ports connected to three said video data channels.

9. Memory apparatus for temporarily storing video data according to claim 7, wherein said video data has a composite form, and wherein each said memory means includes a memory board for each of said video data channels.

10. Memory apparatus for temporarily storing video data according to claim 7, wherein said video data includes separate luminance and chrominance data in a component form, and wherein each said memory means includes two memory boards for each of said video data channels, in which one of said two memory boards is for said luminance data and the other of said two memory boards is for said chrominance data.

* * * * *